United States Patent
Uhl et al.

(10) Patent No.: US 8,787,863 B2
(45) Date of Patent: Jul. 22, 2014

(54) UNIDIRECTIONAL SAMPLING MIXER

(71) Applicants: Brecken H. Uhl, La Mesa, NM (US); Daniel A. Law, Washington, DC (US)

(72) Inventors: Brecken H. Uhl, La Mesa, NM (US); Daniel A. Law, Washington, DC (US)

(73) Assignee: Invertix Corporation, McLean, VA (US)

( * ) Notice: Subject to any disclaimer, the term of this patent is extended or adjusted under 35 U.S.C. 154(b) by 42 days.

(21) Appl. No.: 13/718,692

(22) Filed: Dec. 18, 2012

(65) Prior Publication Data

US 2013/0165066 A1  Jun. 27, 2013

Related U.S. Application Data

(60) Provisional application No. 61/579,319, filed on Dec. 22, 2011.

(51) Int. Cl.
*H04B 1/26* (2006.01)

(52) U.S. Cl.
USPC ........... 455/313; 455/130; 455/131; 455/207; 455/312; 327/358; 327/359

(58) Field of Classification Search
CPC . H04B 1/16; H03D 7/125; H03D 2200/0062; H03D 2200/0068
USPC ......... 455/130, 131, 207, 293, 312, 313, 323; 327/358, 359
See application file for complete search history.

(56) References Cited

U.S. PATENT DOCUMENTS

2010/0103043 A1* 4/2010 Milano .......................... 342/368
2011/0043286 A1* 2/2011 Youngblood ................. 330/295

* cited by examiner

*Primary Examiner* — Tuan Pham
(74) *Attorney, Agent, or Firm* — The Marbury Law Group, PLLC

(57) ABSTRACT

A unidirectional sampling mixer utilizes a stepped phase modulation to shift the frequency of an RF input signal supplied to an RF input switch. An ordered set of phase shift values to be applied to the RF input signal and a set of times each element of which corresponds to a time at which a phase shift value is be applied to the RF signal are determined. For each phase shift value, a controller controls the RF input switch to select an input of a phase shifting device and controls an RF output switch to select an output of the phasing shifting device. The input and the output of the phase shifting device are selected to apply the phase shift value at its corresponding time to the RF input signal. A frequency shifted signal is supplied to an RF output port from an output of the RF output switch.

10 Claims, 8 Drawing Sheets

500 Sampling Mixer

UNIDIRECTIONAL SAMPLING MIXER

CROSS REFERENCE TO RELATED APPLICATIONS

This application claims priority under 35 U.S.C. §119(e) from provisional application Ser. No. 61/579,319 filed Dec. 22, 2011. The 61/579,319 provisional application is incorporated by reference herein, in its entirety, for all purposes.

BACKGROUND

Conventional mixer technology relies on the nonlinear, or square-law, behavior of a semiconductor junction device (diode) to achieve translation of a bandpass modulation signal from one carrier frequency to another. For example, to perform frequency conversion in a conventional radio frequency (RF) diode-based mixer, two excitation signals are used to bias a diode or network of diodes: the local oscillator (LO) signal and the RF signal. The LO signal is typically a continuous-wave (CW) signal, while the RF signal is often a complex bandpass modulated signal. The goal of basic frequency conversion is to preserve the RF signal modulation content, but shift it spectrally to a new intermediate frequency (IF) carrier frequency.

The CW RF signal $\cos(\omega_{RF}t)$ and CW LO signal $\cos(\omega_{LO}t)$ can be used as the AC portion of a diode bias signal v(t) to form $v(t)=(v_{rf}\cos\omega_{rf}t+v_{lo}\cos\omega_{lo}t)$ where $v_{rf}$ is the RF signal AC intensity, $v_{lo}$ is LO signal AC intensity, $\omega_{rf}$ is the RF radian frequency, and $\omega_{lo}$ is the LO radian frequency. The resulting current through the diode, I(v), may be expressed mathematically as a Taylor series. The equation below shows the first three terms in the series:

$$I(v) = \frac{G'_d}{2}(v_{rf}^2 + v_{lo}^2 + v_{rf}^2\cos2\omega_{rf}t + v_{lo}^2\cos2\omega_{lo}t + 2v_{rf}v_{lo}\cos(\omega_{rf}-\omega_{lo})t + 2v_{rf}v_{lo}\cos(\omega_{rf}+\omega_{lo})t)$$

This equation indicates that the two input sinusiod signals (RF and LO) result in several output sinusiod signals at a variety of carrier frequencies. The equation indicates responses at DC, at twice each individual signal carrier frequency, and at the sum and difference frequencies. The conversion frequency $\omega_c$ is defined as $\omega_c=(\omega_{rf}-\omega_{lo})$ or $(\omega_{rf}+\omega_{lo})$. This means that two different RF input frequencies can result in the same output frequency, a limitation of conventional mixer technology.

In general, the mixer output is filtered such that all signal terms except the one at $\omega_c$ is greatly attenuated. The selected $\omega_c$ term is often referred to as the intermediate frequency (IF) term. Practically, attenuation of undesired terms due to filtering is finite, and potentially problematic signal content related to higher-order Taylor series terms is also present at the mixer output.

SUMMARY

Embodiments herein are directed to a frequency conversion circuit and methods for frequency conversion that utilize a stepped phase modulation to shift the frequency of an input signal that does not rely directly on the non-linear behavior of a junction semiconductor device or similar non-linear phenomena like a conventional mixer.

DETAILED DESCRIPTION

Embodiments herein are directed to a frequency conversion circuit and methods for frequency conversion that utilize a stepped phase modulation to shift the frequency of an input signal. In the description that follows, the embodiments are illustrated using an RF signal as the input signal. However, this is not meant as a limitation. By way of further illustration and not by way of limitation, audio signals and light signals may be used as the input signals in the embodiment described herein.

In an embodiment, a "sampling mixer" or "s-mixer" or "smixer," utilizes a time-difference in equivalent excitation location in an electronic device's structure to achieve modulation, including phase modulation. Phase modulation may be used to achieve frequency conversion as is described below.

A sinusoidal time-harmonic signal repeats a $2\pi$ radian amplitude cycle at the same rate (conceptually) for all time. For an existing signal with some time-harmonic carrier radian frequency $\omega_0$, additionally modulating the existing signal with a constant rate of phase will produce an effective frequency shift.

A time-varying radian frequency $\omega_0(t)$ is defined in terms of signal phase $\phi(t)$ by:

$$\omega_0(t) \equiv \frac{d\varphi(t)}{dt}$$

A constant rate of signal phase $\phi(t)=Ct$ achieves a constant carrier radian frequency $\omega_0$ as shown by:

$$\omega_0(t) = \frac{d(Ct)}{dt} \to \omega_0 = C$$

where C is a constant value of phase ramp slope.

Figure 1A:
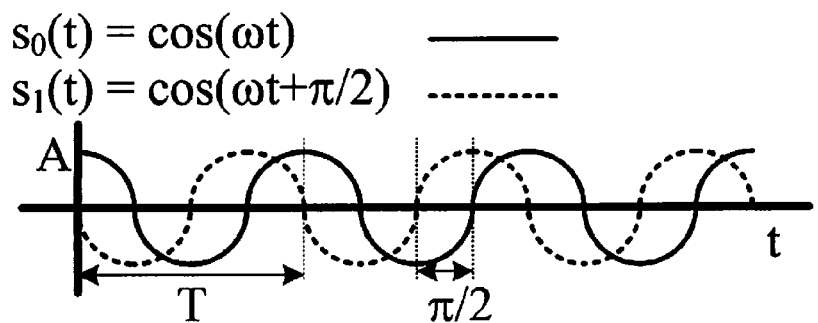
FIG. 1A is a graphical illustration of two cosinusoidal signals.

FIG. 1A is a graphical illustration of two cosinusoidal signals. Signal $s_0(t)$ is taken as the phase reference, and has radian frequency $\omega_0=2\pi f_0$ with corresponding frequency period $T_0=1/f_0$. Signal $s_1(t)$ has an added constant phase term of $\pi/2$, but otherwise shares the same radian frequency and frequency period as $s_0(t)$.

In FIG. 1A, if the reference signal is $s_0(t)$, then the phase of $s_1(t)$ is seen to be at a phase of $+\pi/2$ relative to $s_0(t)$. Conversely, if $s_1(t)$ is declared the reference, then $s_0(t)$ is seen to be at a phase of $-\pi/2$ relative to $s_1(t)$. Phase is also "modulo-$2\pi$", such that it always has a value $0\leq\text{Phase}<2\pi$. As phase approaches $2\pi$ from below, it makes a jump back to 0; the converse is true: as phase approaches 0 from above, it makes a jump back to $2\pi$.

Figure 1B:
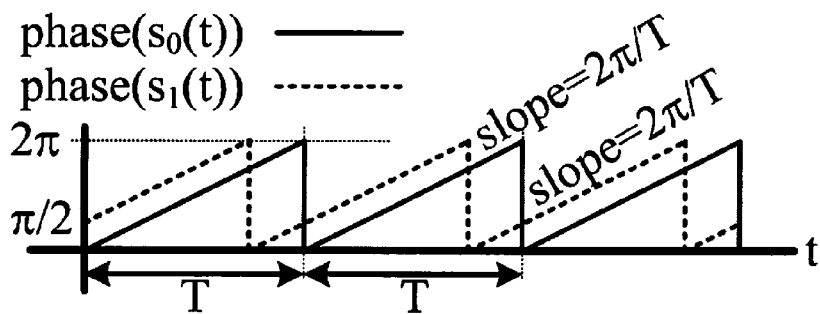
FIG. 1B is a graphical illustration of the phase of each of the cosinusoidal signals, $_{s0}(t)$ and $_{s1}(t)$, in FIG. 1A.

FIG. 1B is a graphical illustration of the phase of each of the cosinusoidal signals, $s_0(t)$ and $s_1(t)$, in FIG. 1A. Note that the phase functions for $s_0(t)$ and $s_1(t)$ have the same slope, but are offset from each other by $\pi/2$.

For some reference frequency $\omega_0$, the modulated radian frequency $\omega_m$ achieved by adding an additional continuous phase modulation ramp $\Delta\phi_m t$ to an existing constant phase rate Ct signal such that $\phi(t)=(C+\Delta\phi_m)t$ can be expressed as:

$$\omega_m(t) = \frac{d((C + \Delta\varphi_m)t)}{dt} \rightarrow \omega_m = \omega_0 + \Delta\omega_m$$

where $\omega_m=\omega_0+\Delta\omega_m$ is the new converted carrier frequency.

Figure 2A:
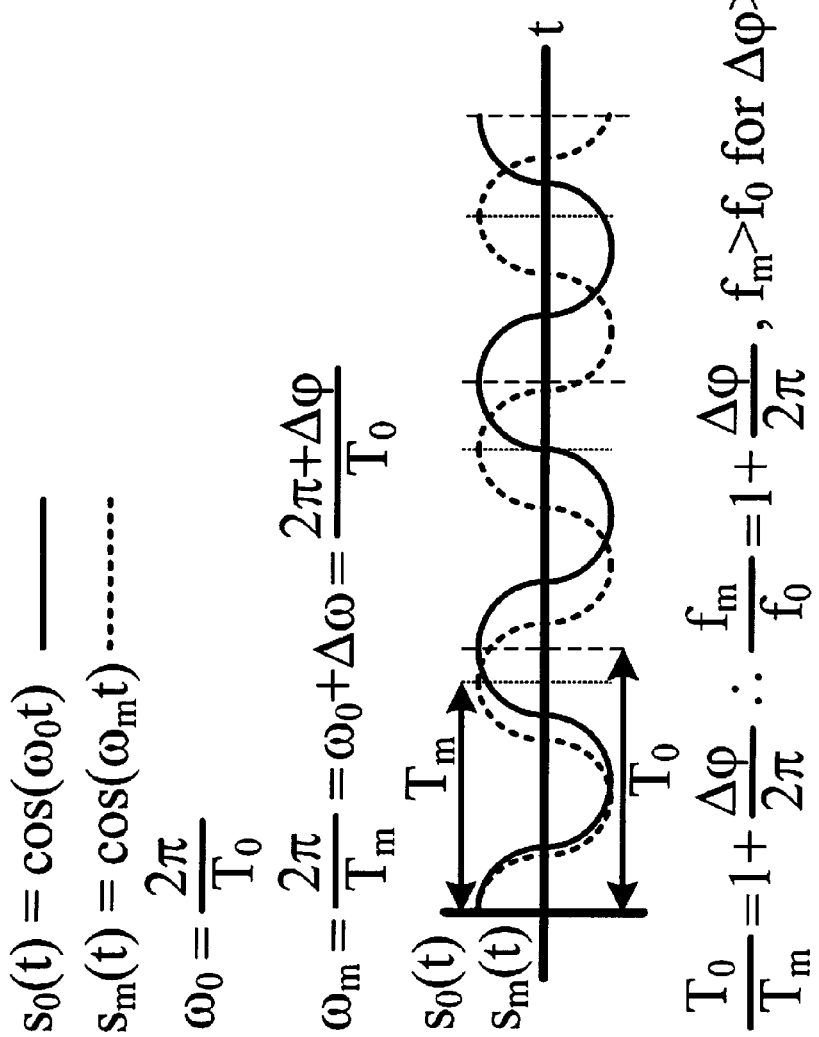
FIGS. 2A and 2B illustrate an effect that changing the rate at which the phase changes has on frequency of a waveform.
Figure 2B:
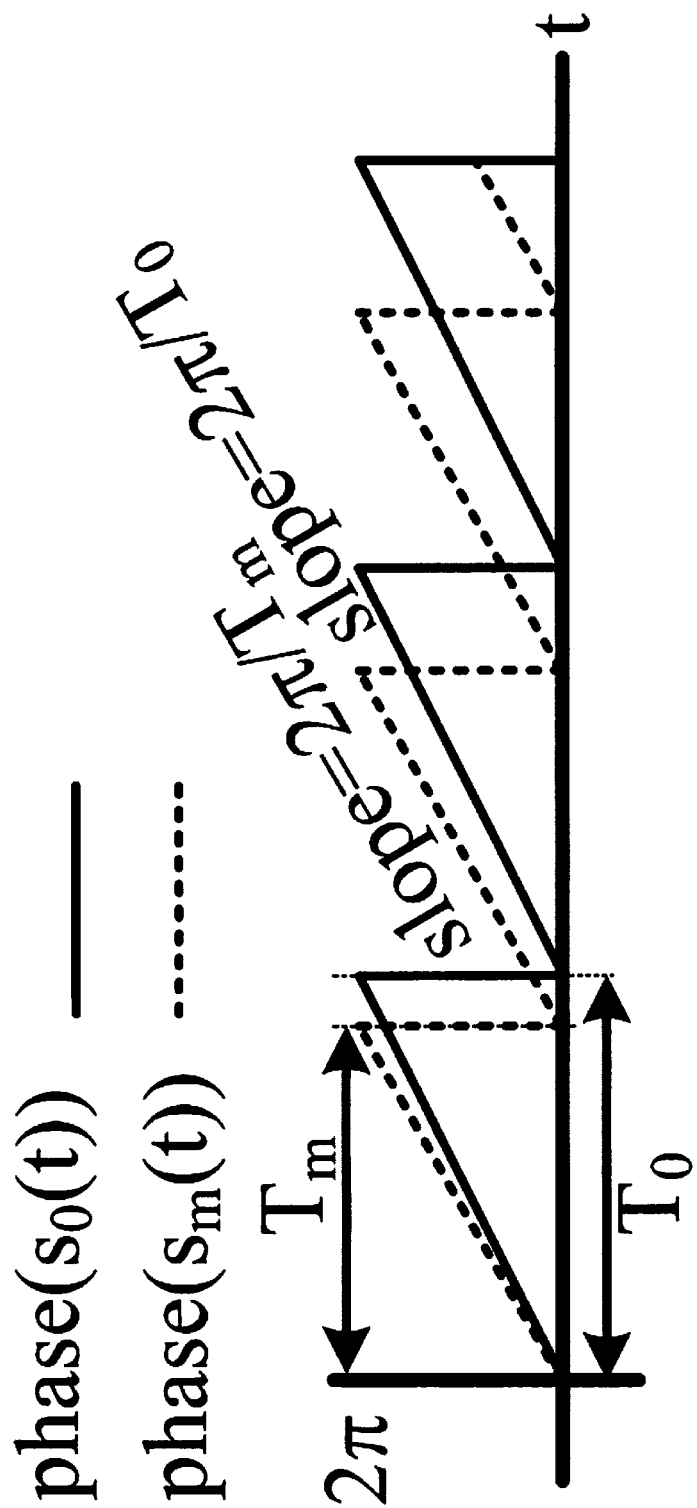

FIGS. 2A and 2B illustrate the effect that changing the rate at which the phase changes has on frequency of a waveform. FIG. 2A shows the reference signal $s_0(t)$ as well as a new modulated signal $s_m(t)$ that has an added phase ramp term. The added phase ramp slope of $s_m(t)$ is $\Delta\phi/T_0$, resulting in an effective radian frequency $\omega_m=2\pi f_m=\omega_0+\omega_m=(2\pi+\Delta\phi)/T_0$. This gives a phase ramp slope to reference phase relationship of $(T_0/T_m)=1+(\Delta\phi/2\pi)$. Correspondingly, the modulated frequency (for $\Delta\phi>0$) has increased, and there is a modulated frequency relationship of $(f_m/f_0)=1+(\Delta\phi/2\pi)$.

In FIG. 2B, the phase relationship between $s_0(t)$ and $s_m(t)$ is shown, where it is apparent that the addition of a phase slope term in $s_m(t)$ relative to $s_0(t)$ has produced a shorter modulated period $T_m<T_0$, and thus a higher frequency $f_m>f_0$.

Figure 3A:
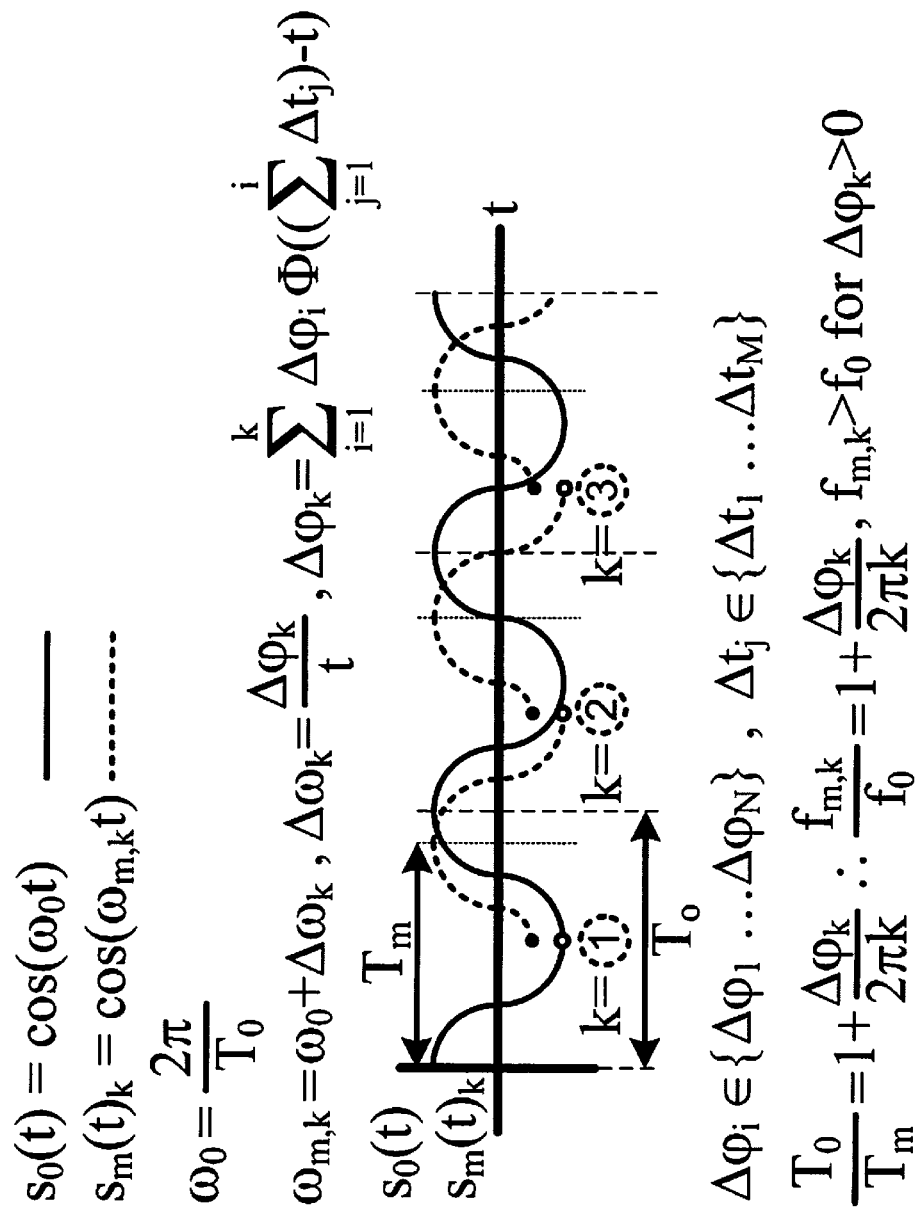
FIGS. 3A and 3B illustrate an approximation of a phase ramp using a step phase modulation according to an embodiment.
Figure 3B:
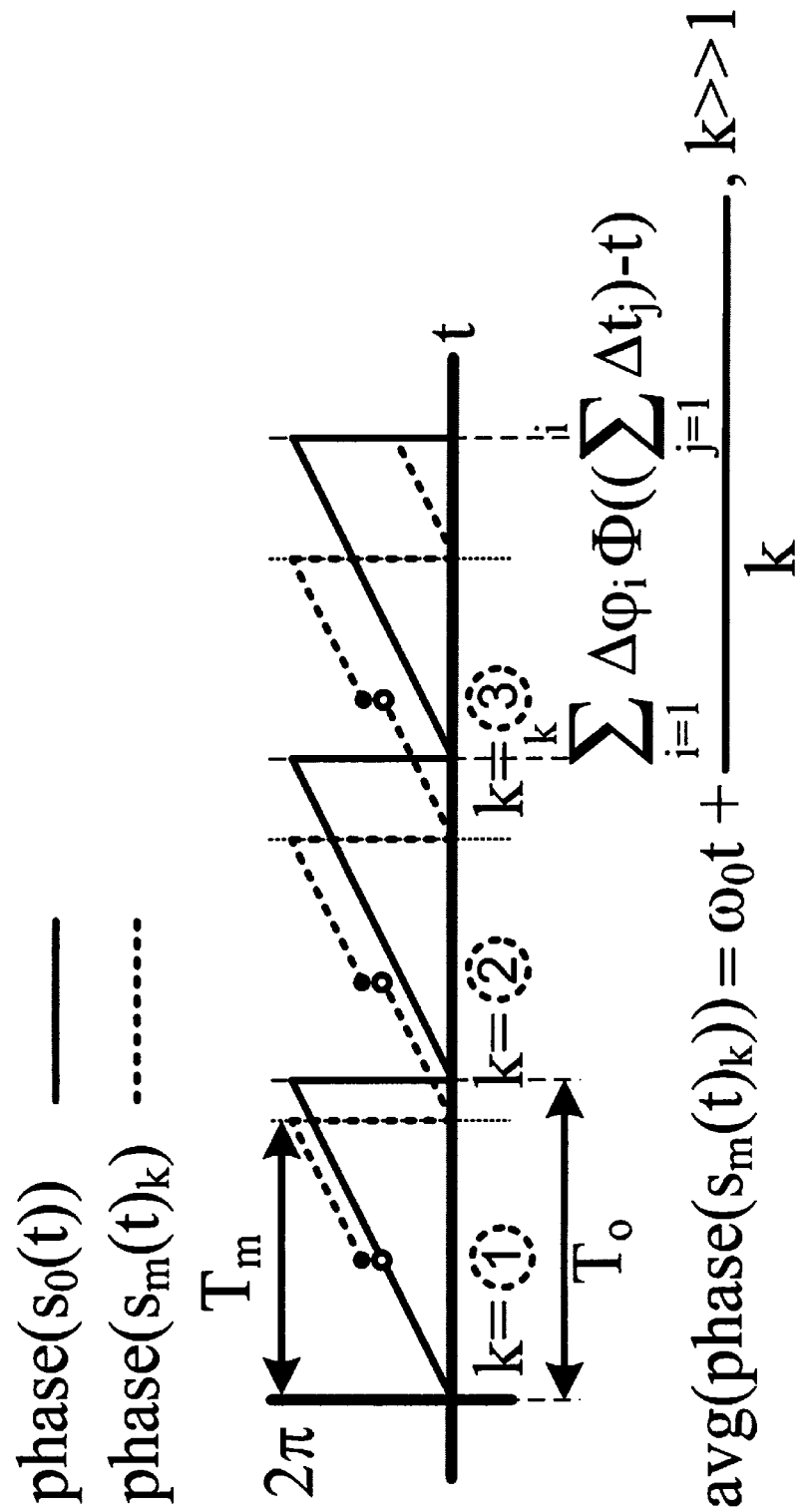

FIGS. 3A and 3B illustrate how a step phase modulation approximates a phase ramp. The general case allows for a set of N phase steps $\Delta\phi_1 \ldots \Delta\phi_N$ and M step phase modulation times $\Delta t_1 \ldots \Delta t_M$, where the relationship between $\Delta\phi_i$ and $\Delta t_j$ is not necessarily fixed for any $k^{th}$ pairing in a modulated sequence. The phase added to $s_m(t)_k$ for the $k^{th}$ modulation step relative to $s_0(t)$ in this case is given in FIG. 3A as $\Delta\phi_k$, which is computed as the sum of k paired $\Delta\phi_i$ and $\Delta t_j$ values up to any time t after the $k^{th}$ phase modulation step, but before the $(k+1)^{st}$ step. The symbol $\Sigma$ is the summation operation over the indicated limits, and the symbol $\Phi$ indicates the Heaviside step function.

A simplification of the general case is specifically depicted in FIG. 3A and FIG. 3B, where $\Delta\phi_i$ and $\Delta t_j$ are each the same for k=1, 2, and 3. As shown in FIG. 3B. the signal phase($s_m(t)$) passes through $2\pi$ faster in time than does phase($s_0(t)$), resulting in a frequency increase for the modulated signal relative to the reference. The average phase of phase($s_m(t)$) is computed as the sum over K phase modulation steps, and is increasingly accurate in the limit for k>>1. The average frequency increase of $s_m(t)_k$ relative to $s_0(t)$ is computed as $f_{m,k}/f_0=1+(\Delta\phi_k)/(2\pi k)$, and is increasingly accurate in the limit for k>>1.

In the following illustrative example, a continuous phase ramp is approximated by a stepped function using N equi-spaced phase modulation states $\Delta\phi_i \in \{\Delta\phi_1 \ldots \Delta\phi_N\}$ with the same time step (M=1) between modulation events $\Delta t_j \in \{\Delta t\} \forall j$ that repeat in the same order for all time. The use of the step function described herein is provided to illustrate the relationship between $\Delta\phi_i$ and $\Delta t_j$ and is not intended to be limiting. This choice results in $\Delta\phi_i$ values selected from among the set:

$$\Delta\varphi_i \in \left\{ \frac{2\pi}{N}, \frac{(2)2\pi}{N}, \ldots \frac{(N-1)2\pi}{N}, 2\pi \right\}$$

For the choice of equi-spaced, repeating $\Delta\phi_i$ with N=4 and a constant modulation rate $\Delta t$, the result is a repeating 4-step modulation process cycling through the modulation states $\Delta\phi_i=0\rightarrow\pi/2\rightarrow\pi\rightarrow3\pi/2$ and back to the start of the sequence in perpetuity (mathematically), where the time between modulation events is a consistent $\Delta t$. In practice, the number of repetitions of the cycle will not be infinite, but may be extremely large.

To approximate a perfectly smooth phase ramp, as $N\rightarrow\infty$, each modulation step duration in the previous equation shrinks to a single point in time, $\Delta t$, and the periodic extension of the stepped wave function approaches a continuous ramp. The frequency conversion effect can also be readily achieved even with a low value of N.

A Fourier series can represent any "well-behaved" periodic signal as a sum of cosinusoids. Well-behaved means that a bounded periodic signal s(t) such that s(t)=s(t+T) (where T is some period of repetition) is continuous except for a finite number of jump discontinuities, and has a finite number of minimums and maximums. Well-behaved describes most communication or other RF signals to within a reasonable degree of accuracy as used by those proficient in the art.

As an example, the Fourier series of the periodic extension of a step-modulated signal $s_1(t)$ can be designated as $fs_1(t)$, and computed according to:

$$fs_1(t) = \frac{a_0}{2} + \sum_{h=1}^{\infty} a_h \cos\left(\frac{h 2\pi t}{T_{CYC}}\right) + b_h \sin\left(\frac{h 2\pi t}{T_{CYC}}\right)$$

where the Fourier coefficients are:

$$a_h = \frac{2}{T_{CYC}} \sum_{k=1}^{K+1} \int_{\Delta t_{k-1}}^{\Delta t_k} s_1(t)_k \cos\left(\frac{h 2\pi t}{T_{CYC}}\right) dt,$$

and $$b_h = \frac{2}{T_{CYC}} \sum_{k=1}^{K+1} \int_{\Delta t_{k-1}}^{\Delta t_k} s_1(t)_k \sin\left(\frac{h 2\pi t}{T_{CYC}}\right) dt,$$

where $b_h=0$ for h=0,
and where $\Delta t_0 \equiv 0$, $\Delta t_{K+1} \equiv T_{CYC}$,
and where $\Delta\phi_{K+1} \equiv 0$,
and where $T_{CYC}$ is the smallest period of time that contains an integer multiple of unmodulated carrier cycles with period $T_0$ as well as an integer multiple of repetitions of all valid $\{\Delta\phi_i, \Delta t_j\}$ pairs in a repeating modulation cycle sequence, such that $T_{CYC}$ consists of a total of K modulation steps and the index k cycles through one or more repetitions of all of the valid $\{\Delta\phi_i, \Delta t_j\}$ pairs in a repeating modulation cycle sequence.

An analysis approximation assumed valid for $T_0<<T_m$ ignores the $T_0$ contribution in calculating K, and instead sets $T_{CYC}$ and K according only to one full repetition of all valid $\{\Delta\phi_i, \Delta t_j\}$ pairs in a repeating modulation cycle sequence such that K is equal to the number of times that each valid pair is used in the sequence.

An analysis approximation assumed valid for $T_0<<|t_{k+1}-t_k|$ ignores the $T_0$ contribution in calculating K, and instead sets $T_{CYC}$ and K according only to one full repetition of all valid $\{\Delta\phi_i, \Delta t_j\}$ pairs in a repeating modulation cycle sequence such that K is equal to the number of times that each valid pair is used in the sequence.

Those practiced in the art can readily evaluate the Fourier Transform of the Fourier Series for any choice of valid $\Delta\phi_i$ and $\Delta t_j$ and verify the modulation effect to their satisfaction. To the extent that an average positive increase in phase due to the modulation is used, the frequency shift effect of the novel technique is demonstrated, and the frequency shift will be towards infinity (i.e., above the native signal frequency ($\omega_0$).)

The average modulation phase can also be negative, in which case the frequency shift will be towards zero (i.e., below the native signal frequency $\omega_0$.)

The S-mixer approach avoids the effect of "image frequencies," since the frequency shift is uni-directional (i.e., either increasing or decreasing); this is of significant benefit and different than a conventional mixer, which converts signals both above and below the local oscillator (LO) signal to the same intermediate frequency (IF).

As $\Delta t$ approaches $1/\omega_0$, transient effects of switching from one feed location to another may be more pronounced and interactive. In an embodiment, complex selections of $\Delta\phi_i$ and $\Delta t_j$ are used to accommodate this effect.

A Sampling Mixer Circuit Using Phase Modulation

Figure 4:
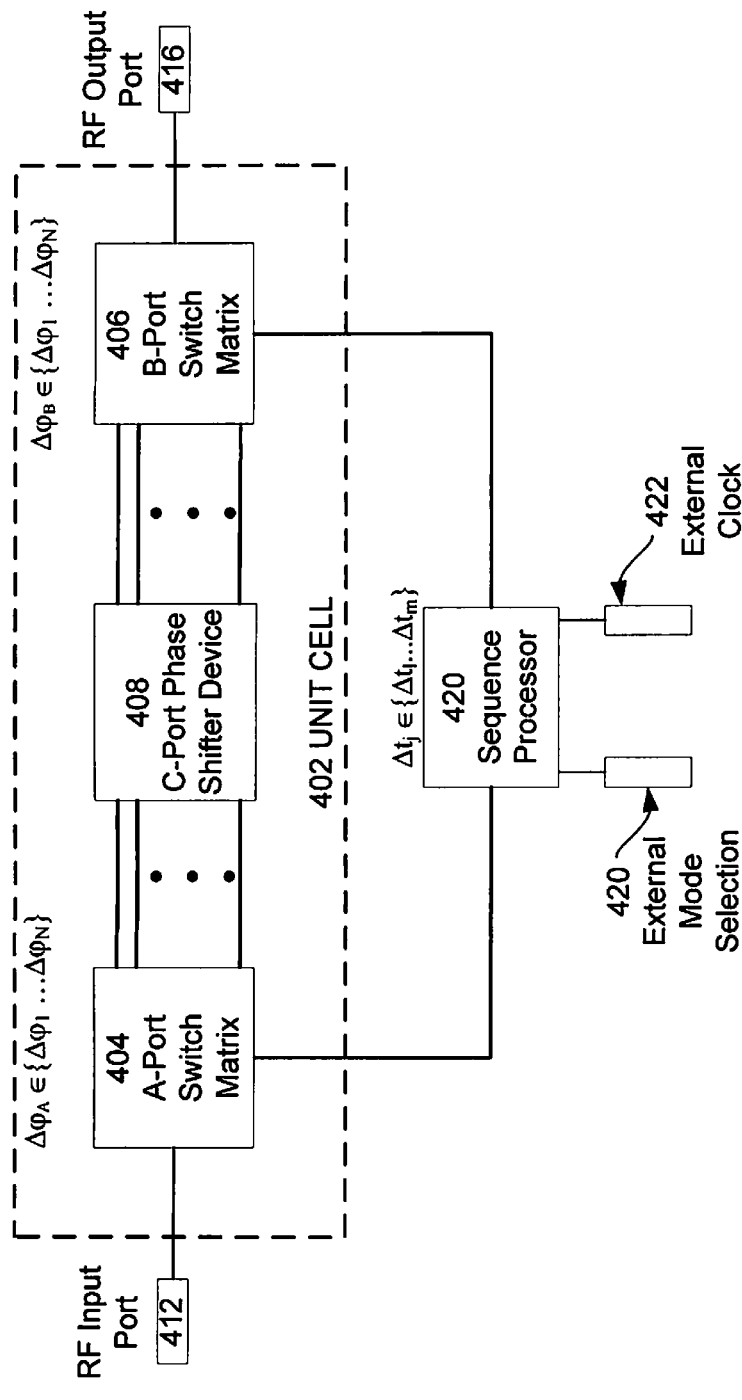
FIG. 4 is a block diagram of a sampling mixer unit cell according to an embodiment.

A sampling mixer (S-Mixer) produces a frequency shift in an input RF signal through the imposition of a series of phase-modulation steps on the input RF signal. A non-limiting sampling mixer unit cell is illustrated in FIG. 4. The RF signal present at the input port 412 is processed through an input switch matrix 404, a phase shifting device 408, and an output switch matrix 406. Different combinations of switch matrix connections from 404 and 406 to the phase shifting device 408 determine different phase modulation steps applied to the RF signal. A sequence processor 420 determines the series of phase shifts and the time at which they occur. The sequence processor 420 determines the switch matrix settings in such a way as to impart an approximate phase ramp on the input RF signal such that the output RF signal (delivered to output port 416) is shifted in frequency.

Figure 5:
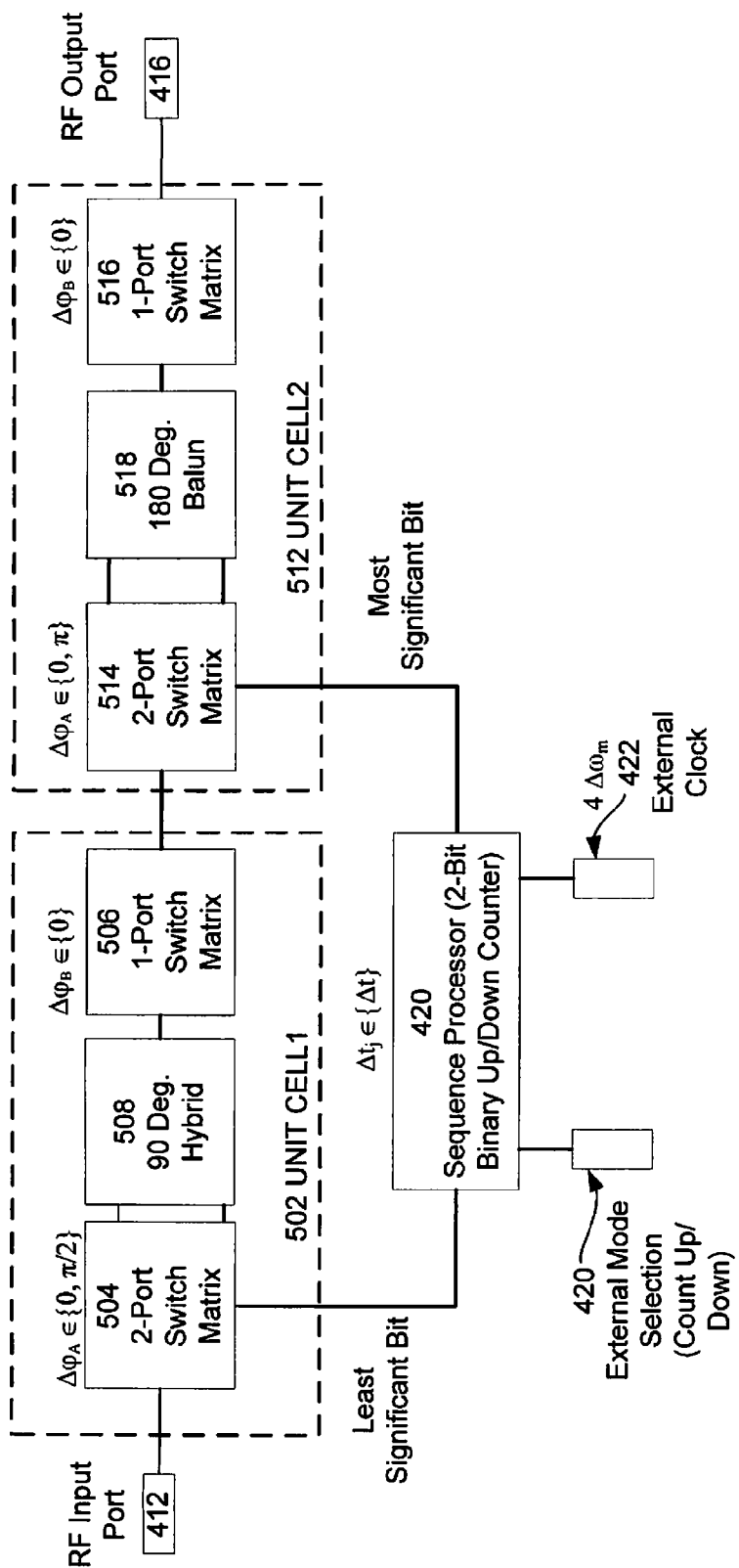
FIG. 5 is a block diagram of sampling mixer having two cells according to an embodiment.

In an example illustrated in FIG. 5, two unit cells are utilized in conjunction with a single sequence processor. However, this is not meant as a limitation. More than one unit cell can be cascaded and controlled by a single sequence processor.

Referring again to FIG. 4, the input switch matrix 404 and the output switch matrix 406 each switch matrix interfaces to phase shifting device 408 to produce a sub-set of all of the available phase modulation step values $\Delta\phi_i \epsilon \{\Delta\phi_1 \ldots \Delta\phi_N\}$. The sub-set supported by the input switch matrix is $\Delta\phi_A$. The input switch matrix 404 has an integer number of ports equal to A. It is allowed that A=1, in which case the switch matrix has only one state and no sequence processor control is required. A=0 is not allowed. The sub-set supported by the output switch matrix 406 is $\Delta\phi_B$, and the input switch matrix has an integer number of ports equal to B. It is allowed that B=1, in which case the switch matrix has only one state and no sequence processor control is required. B=0 is not allowed.

The phase shifter device 408 may be an RF, microwave, or antenna device that achieves different phase shifting effects by means of spatial port selection. By way of illustration and not by way of limitation, the phase shifter device 408 may be a 4-port quadrature hybrid microwave type of component. Selecting a different spatial port on the input to, or output from, a quadrature hybrid produces a phase shift on the output signal relative to the input signal.

Alternatively, the phase shifter device 408 may be a spatially-modulated antenna structure, such as one produced through direct spatial antenna modulation (DSAM). A non-limiting example of a spatially-modulated antenna structure is described in U.S. patent application Ser. No. 12/277,901, filed Nov. 25, 2008 and U.S. patent application Ser. No. 12/725,721 filed Mar. 17, 2010, both herein incorporated by reference. In a receive mode, any antenna has only one input, that being an intercepted electromagnetic wave interacting with the antenna structure, and thus has a 1-port input selection matrix. The output switch matrix for the DSAM example can interface with up to the total number of spatial ports available from the antenna. In an antenna transmit mode, the roles of the ports are reversed, and the input switch matrix has up to the total number of spatial ports available from the antenna while the output switch matrix has only a single port which produces the travelling wave at the output of the antenna.

The sequence processor 420 controls the order and timing of the phase modulation steps applied to the RF input signal. The total phase modulation step states that the sequence processor 420 can access is determined by the input and output switch matrix (404 and 406 respectively) connections to the phase shifter device 408, and may be represented as the set $\Delta\phi_i \epsilon \{\Delta\phi_1 \ldots \Delta\phi_N\}$. The times that the phase steps take place relative to the prior phase step available to the sequence processor 420 is drawn from the set $\Delta t_j \epsilon \{\Delta t_1 \ldots \Delta t_M\}$.

The order and timing of the phase modulation steps is determined by the sequence processor 420 such that the RF input signal is modulated with a stepped approximation of a constant phase ramp, thus producing a spectral frequency shift in an RF input signal (applied to the input port 412) as the signal is processed through the unit cell 402 or cascade of unit cells (illustrated as cells 502 and 512 in FIG. 5) and appears at the RF output port 416.

A positive phase ramp modulation produces an upward frequency shift, and a negative phase ramp produces a downward frequency shift. This frequency shift effect is unique relative to a conventional mixer, since it is spectrally uni-directional; a conventional mixer always converts two different spectral input frequencies to the same output frequency (one above the LO frequency and one below the LO frequency), as is well known to those practiced in the art. The sequence processor may accept an external clock signal or may generate an internal clock signal used to set the basic rate off of which the timing set $\Delta t_j \epsilon \{\Delta t_1 \ldots \Delta t_M\}$ is determined. Furthermore, the sequence processor may accept external mode selection signals to control aspects of its behavior such as the direction of the frequency shift or to select different pairings and sequences of $\Delta t_j$ and $\Delta\phi_i$.

There are many useful pairings and sequences of $\Delta t_j$ and $\Delta\phi_i$ that may be used by the sequence processor 420. These pairings and sequences may be selected according to limitations of components in the unit cell or cells in an embodiment, or due to limitations in the external clock input. Pairings and sequences may also be selected for reasons related to input or output spectral content, as the Fourier analysis of specific choices in an embodiment would reveal.

Figure 6:
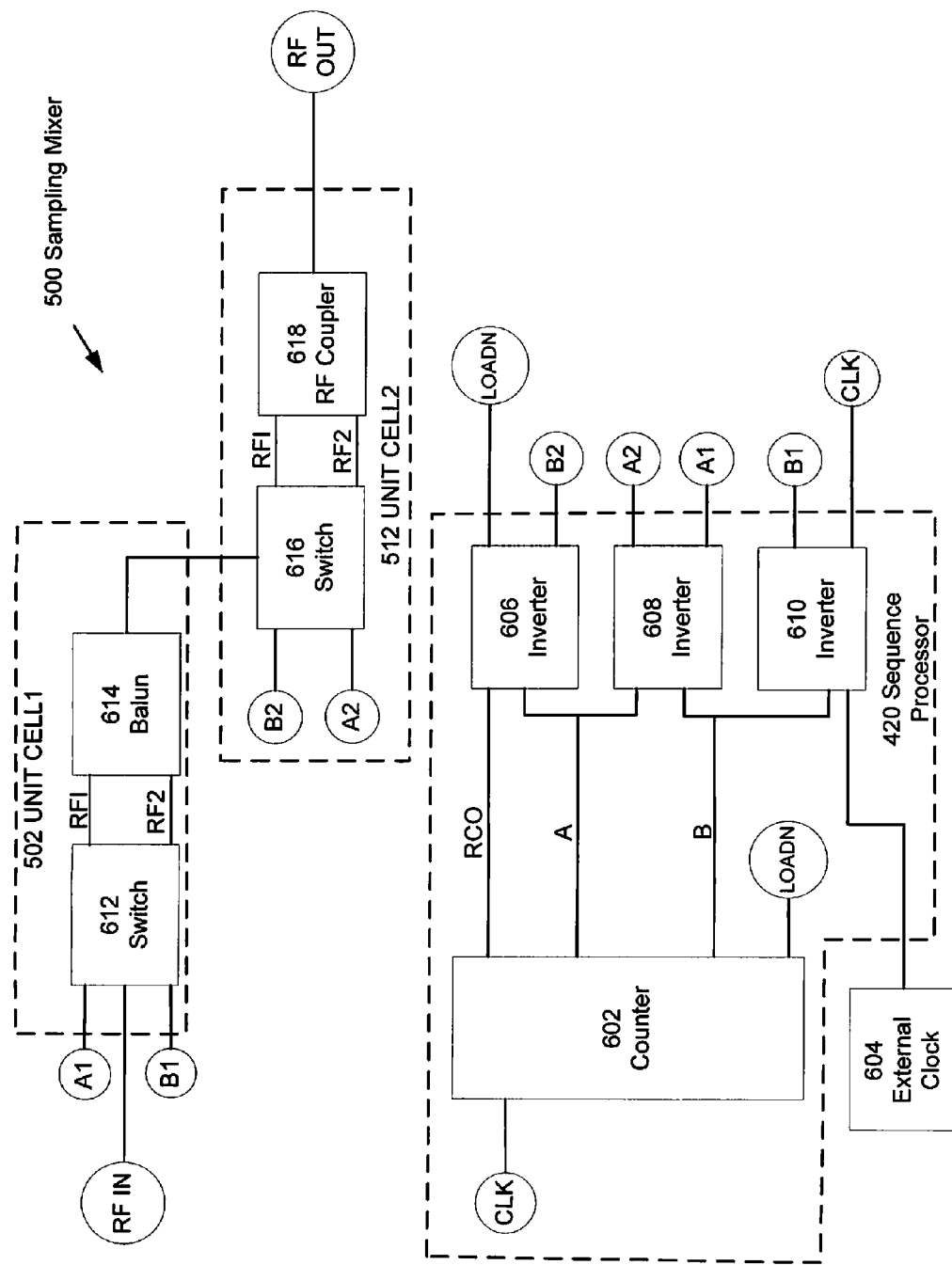
FIG. 6 illustrates a mixer circuit according to an embodiment.

To achieve a frequency shift, the sequence and pairing are selected to produce an approximation of a constant phase modulation ramp. A simple example of an embodiment is illustrated in FIG. 5 and FIG. 6.

FIG. 5 illustrates a conceptual view of a sampling mixer comprising two cells. FIG. 6 is a non-limiting example of particular circuitry selected to implement the embodiment illustrated in FIG. 5. As seen in FIG. 5 and FIG. 6, the embodiment consists of a single sequence processor and two unit cells. The first unit cell 502 has an input switch matrix 504 that can access two phase states $\Delta\phi_A \epsilon \{0, \pi/2\}$ of a phase shifting device 508 (a quadrature hybrid) and an output switch matrix 506 that has access to a single phase state $\Delta\phi_B \epsilon \{0\}$ (essentially acting as a wire). The second unit cell 512 has an input switch matrix 514 that can access two phase states $\Delta\phi_A \epsilon \{0, \pi\}$ of a phase shifting device 518 (a balun) and an output switch matrix 516 that has access to a single phase state $\Delta\phi_B \epsilon \{0\}$ (essentially acting as a wire).

Thus, the cascaded combination of all unit cells in the embodiment can produce any combined phase modulation value in the set $\Delta\phi_i \in \{0, \pi/2, \pi, 3\pi/2\}$. The embodiment has a single time delay between successive phase modulation events $\Delta t_i \in \{\Delta t\}$, and thus sequences through the available phase modulation states at a constant rate. The action of this sequence processor of this particular embodiment is to implement a 2-bit digital counter. The digital counter function has a most-significant bit and a least-significant bit. In this embodiment, an external signal can determine whether the counter counts upwards (increments) or downward (decrements). The choice of sequence and timing in this embodiment results in a cycling through the 4 available phase modulation states in the sequence $\Delta\phi_i = 0 \rightarrow \pi/2 \rightarrow \pi \rightarrow 3\pi/2$ and back to the start of the sequence in perpetuity (mathematically), where the time between modulation events is a constant $\Delta t$.

This embodiment accepts an external clock signal at radian frequency $\omega_{EXT}$, with corresponding frequency $f_{EXT} = \omega_{EXT}/2\pi$ and period $T_{EXT} = 1/f_{EXT}$. This embodiment applies a 1:1 relationship between the external clock signal and $\Delta t$ such that $\Delta t = T_{EXT}$, though this is not meant as a limitation. Since there are 4 modulation states that repeat in a simple sequence at a constant rate, the RF signal frequency shift produced by the embodiment is $\Delta\omega_m = \omega_{EXT}/4$. Thus, an input RF signal with radian frequency $\omega_0$ is converted at the output of the second unit cell 512 to one with a radian frequency of $\omega_0 + \Delta\omega_m$, for an upwards-counting mode selection, or to $\omega_0 - \Delta\omega_m$ for a downwards-counting mode selection.

FIG. 6 is a block diagram of a schematic of a sampling mixer (or "s-mixer") according to an embodiment. The s-mixer illustrated in FIG. 6 generates four states, (i.e., N=4) but this is not meant as a limitation. The circuit of FIG. 6 may be adapted to generate any number of states.

A counter 602 is controlled by a clock signal (clk). The clk signal is triggered by an external clock 604 and generated by dual-channel inverter 610. The counter 602 is configured as a 4-bit counter having a designated start count. For example, in an embodiment, the counter 602 is a CD74AC163 or similar device and pins 3,4,5,6 are set to establish a start count. When the counter reaches 15, the Ripple Carry Out (RCO) pin is initialized to a high state for one clock cycle. This signal is then inverted by the first dual-channel Schmitt trigger inverter 606 and fed to the low-enabled LOADN pin of the counter 602. The counter responds to the presence of the LOADN signal by resetting the counter 602 to the start count. In an embodiment, the start count is zero (binary 0000). Regardless of where the count may start on power-up, the binary output on pins A and B of the counter 602 count continuously from 0-3.

These counting signals are fed into a network of dual-channel inverters 606, 608 and 610. For example, in an embodiment the inverters may be SN74LVC2G14 or similar devices. The inverters control RF switches 612 and 616. For example, in an embodiment, the switches may be HMC174 devices. The RF switch 612 is connected to an RF input and receives signals A1 and B1 from inverters 608 and 610. The output of the RF switch 612 is fed to a Balun 614. For example, in an embodiment, the Balun is a BD1631J50100AHF or similar device. The RF switch 616 receives the output of the Balun 614 and signals A2 and B2 from inverters 608 and 606.

As the counter 602 operates, the inverters 606, 608 and 610 produce four states that may be applied to the RF switches 612 and 616. Signals A1, B1 control the first RF switch 612 that routes the RF input through to the Balun 614. Depending on the count, the RF signal that is produced by the Balun 614 and received by the RF switch 616 is offset by either a 0° or 180° degree phase shift. The RF switch 616 is controlled by signals A2, B2 and reroutes the RF signal to different ports of an RF coupler (quadrature hybrid) 618. For example, in an embodiment, the RF coupler is an X3C19P1-03S or similar device. The RF coupler 618 acts as a power combiner and offsets RF energy by 0° or 90° depending on which port the RF switch 616 routes to. This offset imposed by the RF coupler 618 is also determined by the current count.

Because only the first two bits of the counter are used in this example, there are only four different states/configurations possible for the RF network. The states are summarized in Table 1 below:

TABLE 1

| State: | Clock: | A1: | B1: | A2: | B2: | Net Phase Offset: |
|---|---|---|---|---|---|---|
| 0 | 1 | 0 | 1 | 0 | 1 | 0° |
| 0 | 0 | 0 | 1 | 0 | 1 | 0° |
| 1 | 1 | 0 | 1 | 1 | 0 | 90° |
| 1 | 0 | 0 | 1 | 1 | 0 | 90° |
| 2 | 1 | 1 | 0 | 0 | 1 | 180° |
| 2 | 0 | 1 | 0 | 0 | 1 | 180° |
| 3 | 1 | 1 | 0 | 1 | 0 | 270° |
| 3 | 0 | 1 | 0 | 1 | 0 | 270° |

State transitions happen on the rising edge of the clock signal, and a simple state sequence of 0→90→180→270 that loops back on itself is used for the case of an up-counting configuration that produces a positive frequency shift. However, the circuit illustrated in FIG. 6 is not meant to be limiting.

Frequency downshifting may be accomplished by reversing the direction of the phase offset. In the circuit illustrated in FIG. 6, the counter may be configured to start at 3 and count down to 0.

It will be understood by those skilled in the art that the present invention may be embodied in other specific forms without departing from the scope of the invention disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the," is not to be construed as limiting the element to the singular.

What is claimed is:

1. A method for shifting a frequency of a radio frequency (RF) signal in a selected direction, the method comprising:
   supplying an RF input signal to a first RF input switch from an RF input port;
   determining an ordered set of phase shift values to be applied to the RF input signal;
   determining a set of times each element of which corresponds to a time at which a phase shift value is to be applied to the RF signal;
   for each phase shift value within the ordered set of phase shift values:
   controlling the first RF input switch to select an input of a first phase shifting device and controlling a second RF input switch to select an input of a second phase shifting device, wherein the input of the first phase shifting device and the input of the second phase shifting device are selected to apply the phase shift value at its corresponding time to the RF input signal; and supplying the output of the first phase shifting device to the second phase shifting device via the second RF input switch; and supplying to an RF output port a frequency shifted signal from an output of the second phase shifting device.

2. The method of claim 1, wherein the frequency shifted signal is higher in frequency than the RF input signal.

3. The method of claim 1, wherein the frequency shifted signal is lower in frequency than the RF input signal.

4. The method of claim 1, wherein the RF input signal is a modulated signal.

5. The method of claim 1, wherein the phase shifting device is selected from the group consisting of a 90 degree hybrid, a 180 degree balun and a spatially-modulated antenna structure.

6. An apparatus to shift a frequency of a radio frequency (RF) signal in a selected direction, the apparatus comprising:

a first RF input switch configured to receive an RF input signal from an RF input port;

a first phase shifting device, wherein an output of the first RF input switch is electrically connected to an input of the first phase shifting device;

a second RF input switch;

a second phase shifting device, wherein an input of the second RF input switch is electrically connected to an output of the first phase shifting device and wherein an output of the second RF input switch is electrically connected to an input of the second phase shifting device; and a controller, wherein the controller is electrically connected to the first and second input switches and is configured to perform operations comprising:

receiving an ordered set of phase shift values to be applied to the RF input signal;

receiving a set of times each element of which corresponds to a time at which a phase shift value is to be applied to the RF signal;

for each phase shift value within the ordered set of phase shift values, controlling the first RF input switch to select an input of the first phase shifting device and controlling the second RF input switch to select an input of the second phasing shifting device, wherein the input of the first phase shifting device and the input of the second phase shifting device are selected to collectively apply the phase shift value at its corresponding time to the RF input signal;

directing the RF input signal to the first phase shifting device via the first input switch; and directing the output of the first phase shifting device to the second phase shifting device via the second input switch, wherein the second phase shifting device is configured for sending a frequency shifted signal to an RF output port.

7. The apparatus of claim 6, wherein the frequency shifted signal is higher in frequency than the RF input signal.

8. The apparatus of claim 6, wherein the frequency shifted signal is lower in frequency than the RF input signal.

9. The apparatus of claim 6, wherein the RF input signal is a modulated signal.

10. The apparatus of claim 6, wherein the phase shifting device is selected from the group consisting of a 90 degree hybrid, a 180 degree balun and a spatially-modulated antenna structure.

* * * * *